United States Patent
Wang et al.

(10) Patent No.: US 8,952,839 B2
(45) Date of Patent: Feb. 10, 2015

(54) SUCCESSIVE APPROXIMATION REGISTER ANALOG-TO-DIGITAL CONVERTER WITH MULTIPLE CAPACITIVE SAMPLING CIRCUITS AND METHOD

(71) Applicants: Xiaodong Wang, Austin, TX (US); Shouli Yan, Austin, TX (US); Axel Thomsen, Austin, TX (US); Jinwen Xiao, Sunnyvale, CA (US)

(72) Inventors: Xiaodong Wang, Austin, TX (US); Shouli Yan, Austin, TX (US); Axel Thomsen, Austin, TX (US); Jinwen Xiao, Sunnyvale, CA (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/732,113

(22) Filed: Dec. 31, 2012

(65) Prior Publication Data

US 2014/0184435 A1     Jul. 3, 2014

(51) Int. Cl.

| H03M 1/38 | (2006.01) |
|---|---|
| H03K 5/24 | (2006.01) |
| H03M 1/12 | (2006.01) |
| H03M 1/00 | (2006.01) |
| H03M 1/80 | (2006.01) |
| H03M 1/06 | (2006.01) |

(52) U.S. Cl.
CPC . *H03M 1/38* (2013.01); *H03K 5/24* (2013.01); *H03M 1/12* (2013.01); *H03M 1/00* (2013.01); *H03M 1/804* (2013.01); *H03M 1/0695* (2013.01)
USPC .......................................... 341/161; 341/155

(58) Field of Classification Search
CPC ..... H03M 1/0695; H03M 1/12; H03M 1/804; H03M 1/00

USPC .................. 341/161, 155, 172, 118, 120, 122
See application file for complete search history.

(56) References Cited

U.S. PATENT DOCUMENTS

| 4,860,232 | A | * | 8/1989 | Lee et al. ....................... 702/104 |
|---|---|---|---|---|
| 6,686,865 | B2 | | 2/2004 | Confalonieri et al. |
| 6,977,607 | B2 | | 12/2005 | Leung et al. |
| 7,276,962 | B1 | | 10/2007 | Tomasi |
| 7,830,295 | B2 | | 11/2010 | Ikeda et al. |
| 7,969,167 | B2 | | 6/2011 | Khanna et al. |
| 8,022,856 | B2 | | 9/2011 | Sakakibara |
| 8,072,360 | B2 | * | 12/2011 | Byrne et al. .................. 341/118 |
| 2003/0234736 | A1 | | 12/2003 | Tachibana et al. |
| 2010/0001892 | A1 | | 1/2010 | Aruga et al. |
| 2011/0241912 | A1 | | 10/2011 | Doris et al. |

OTHER PUBLICATIONS

Ay, Suat U., "A sub-1 Volt 10-bit supply boosted SAR ADC design in standard CMOS," Journal of Analog Integrated Circuits and Signal Processing (Feb. 2011) vol. 66, Issue 2, pp. 213-221.
W. Liu, P. Huang, and Y. Chiu, "A 12b 22.5/45Ms/s 3.0mW 0.059mm2 CMOS SAR ADC Achieving Over 90dB SFDR," ISSCC Dig. Tech. Papers, pp. 380-381, Feb. 2010.

* cited by examiner

*Primary Examiner* — Joseph Lauture
(74) *Attorney, Agent, or Firm* — Cesari & Reed, LLP; R. Michael Reed

(57) ABSTRACT

A circuit includes a comparator including a first input, a second input, and an output. The circuit further includes a plurality of capacitive sampling circuits configured to be selectively coupled to the first and second inputs. Each of the plurality of capacitive sampling circuits includes first and second capacitors, and includes first and second conversion switches configured to selectively couple the first and second capacitors to the first and second inputs, respectively. The first and second conversion switches of a selected one of the plurality of capacitive sampling circuits are closed to couple the selected one to the first and second inputs of the comparator during a conversion phase.

20 Claims, 3 Drawing Sheets

US 8,952,839 B2

SUCCESSIVE APPROXIMATION REGISTER ANALOG-TO-DIGITAL CONVERTER WITH MULTIPLE CAPACITIVE SAMPLING CIRCUITS AND METHOD

FIELD

The present disclosure is generally related to successive approximation registers (SARs), and more particularly to SAR analog-to-digital converter (ADC) circuits configured to process multiple inputs, and associated methods.

BACKGROUND

An ADC is a device for converting an analog signal into a digital code. The ADC samples the analog signal and converts the sampled analog signal into a digital code or digital signal corresponding to magnitude of the sampled analog signal. Among ADCs, an SAR ADC combines digital codes and compares the combined digital code with an analog signal to approximate to the analog signal.

In a high speed SAR ADC, the SAR ADC may operate at a conversion clock rate that is faster than the ADC throughput rate. Further, the circuitry within the feedback path may operate at a relatively high data rate during conversion.

SUMMARY

In an embodiment, a circuit includes a comparator including a first input, a second input, and an output. The circuit further includes a plurality of capacitive sampling circuits configured to be selectively coupled to the first and second inputs. Each of the plurality of capacitive sampling circuits includes first and second capacitors, and includes first and second conversion switches configured to selectively couple the first and second capacitors to the first and second inputs, respectively. The first and second conversion switches of a selected one of the plurality of capacitive sampling circuits are closed to couple the selected one to the first and second inputs of the comparator during a conversion phase.

In another embodiment, a method includes sampling at least one input signal onto one or more of a plurality of capacitive sampling circuits during a sampling phase from first and second input terminals. The method further includes charging a plurality of feedback capacitors coupled to first and second inputs of a comparator to a programmable voltage level and selectively coupling a selected one of the plurality of capacitive sampling circuits to the first and second inputs of the comparator during a conversion phase. The comparator is configured to produce a digital value corresponding to the at least one input signal. The method further includes producing a digital code related to the digital value using a successive approximation register.

In still another embodiment, a circuit includes a comparator including a first input, a second input, and an output. The circuit further includes a successive approximation register (SAR) including an SAR input coupled to the output of the comparator and including an SAR output terminal configured to provide a control signal. The circuit also includes a plurality of capacitive sampling circuits configured to be selectively coupled to the first and second inputs of the comparator, and includes a capacitive feedback circuit coupled to the first and second inputs of the comparator and responsive to the control signal to apply first and second feedback voltages to the first and second inputs.

BRIEF DESCRIPTION OF THE DRAWINGS

In the following discussion, the same reference numbers are used in the various embodiments to indicate the same or similar elements.

DETAILED DESCRIPTION OF ILLUSTRATIVE EMBODIMENTS

Embodiments of an SAR ADC are described below that provide a high-speed, high-accuracy analog-to-digital conversion, even with multiple, relatively-slow and loosely defined (i.e., high swing) inputs. In an example, a frequency of a conversion clock ($f_{CONV}$) of an SAR ADC may be much faster than the throughput rate of the ADC ($f_{ADC}$). For an SAR ADC that has N bits, the frequency of the conversion clock may be determined as follows:

$$f_{CONV} = (N+M) \cdot f_{ADC} \qquad (1)$$

where the variable (M) relates to the number of extra cycles the SAR ADC uses to track the input. The feedback path of the typical SAR ADC may operate very fast during conversion and may be implemented in a relatively low-voltage, metal-oxide semiconductor (MOS) domain, though the input may be general purpose and may be implemented with high-voltage tolerant circuit elements to accommodate the variability of the loosely defined input signal.

Embodiments of the SAR ADC described below separate the sampling capacitor(s) from the feedback capacitor(s). In an embodiment, the reference voltage ($V_{REF}$) and the switches that control the feedback capacitor array can be implemented in the low-voltage MOS domain, reducing overall power consumption and reducing the overall circuit cost. Further, the sampling capacitor values can be programmed to achieve a rail-to-rail input range according to the following equation:

$$\frac{-V_{REF} * C_{fb_{sum}}}{C_{Sample}} \leq Input_{Range} \leq \frac{V_{REF} * C_{fb_{sum}}}{C_{Sample}} \qquad (2)$$

Thus, the input range can extend from rail-to-rail. One possible embodiment of an SAR ADC is described below with respect to FIG. 1.

Figure 1:
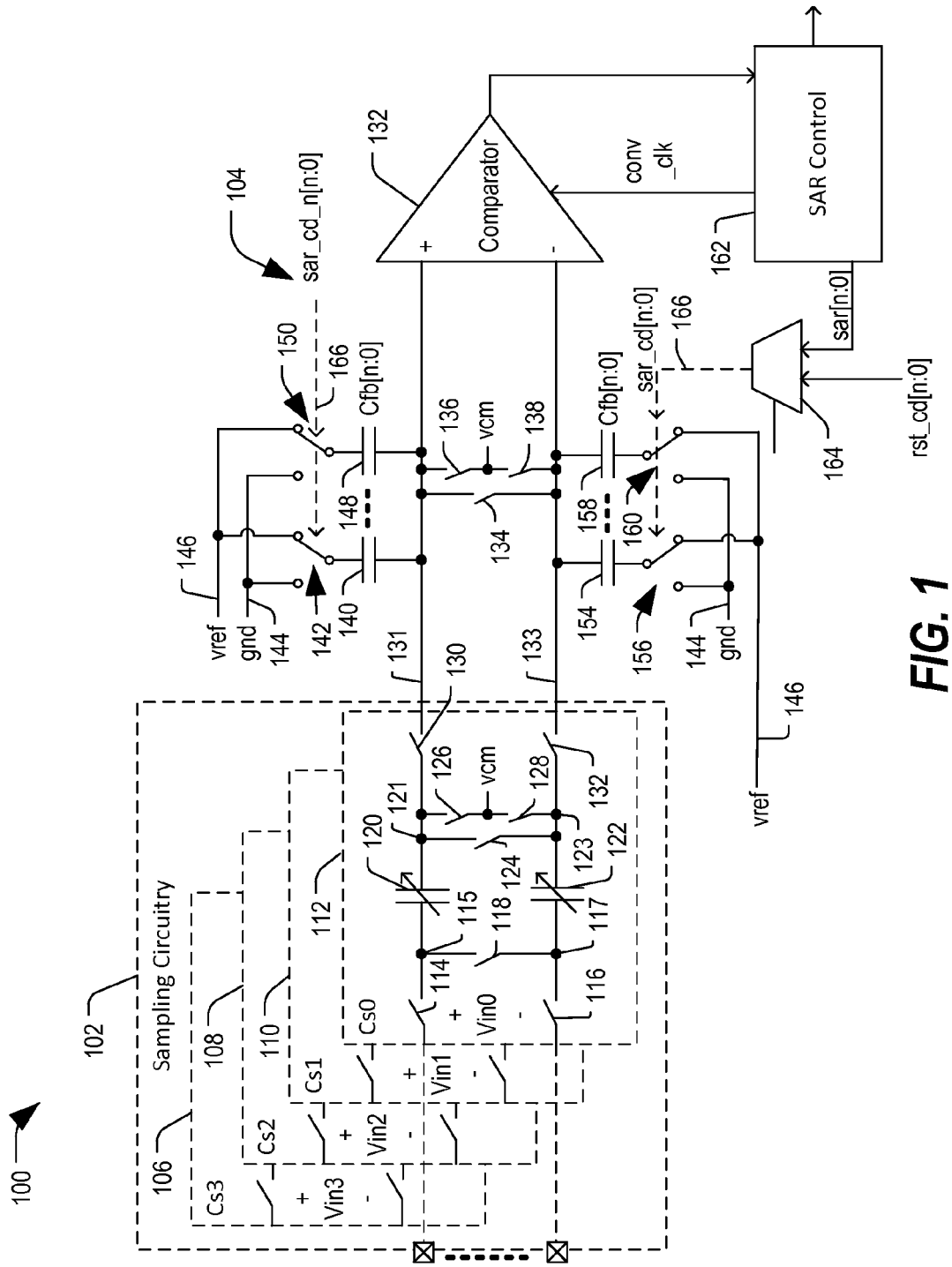
FIG. 1 is a diagram of an embodiment of an SAR ADC according to an embodiment.

FIG. 1 is a diagram of an embodiment of an SAR ADC 100 according to an embodiment. SAR ADC 100 includes sampling circuitry 102 and feedback circuitry 104. Sampling circuitry 102 includes multiple capacitive sampling circuits 106, 108, 110, and 112 (labeled "Cs0", "Cs1", "Cs2", and "Cs3"). While the illustrated embodiment depicts four capacitive sampling circuits 106, 108, 110, and 112, sampling circuitry 102 may include any number of capacitive sampling circuits. Each of the multiple sampling circuits 106, 108, 110, and 112 may be coupled to a signal source (such as a conductive trace or circuit) configured to provide a signal.

Capacitive sampling circuit 112 includes a switch 114 including a first terminal coupled to a pin or pad and a second terminal coupled to a node 115. Capacitive sampling circuit 112 further includes a switch 116 including a first terminal coupled to a pin or pad and a second terminal coupled to a node 117. Capacitive sampling circuit 112 includes a switch 118 including a first terminal coupled to node 115 and a second terminal coupled to node 117. Capacitive sampling circuit 112 further includes a capacitor 120 including a first terminal coupled to node 115 and a second terminal coupled to a node 121. Capacitive sampling circuit 112 further includes a capacitor 122 including a first terminal coupled to node 117 and a second terminal coupled to a node 123. Capacitive sampling circuit 112 includes a switch including a first terminal coupled to node 121 and a second terminal coupled to node 123. Further, capacitive sampling circuit 112 includes a switch 126 including a first terminal coupled to node 121 and a second terminal coupled to a bias terminal, which may be configured to provide a sample common mode signal. Capacitive sampling circuit 112 further includes a switch 128 including a first terminal coupled to the bias terminal and a second terminal coupled to node 123. Capacitive sampling circuit 112 further includes a conversion switch 130 including a first terminal coupled to node 121 and a second terminal coupled to a node 131. Capacitive sampling circuit 112 further includes a conversion switch 132 including a first terminal coupled to node 123 and a second terminal coupled to node 133. Capacitive sampling circuits 106, 108, and 110 have similar switches and capacitors to provide the same functionality as capacitive sampling circuit 112 for a different set of inputs.

Feedback circuitry 104 includes a comparator 132 including a positive input coupled to node 131 and a negative input coupled to node 133. Feedback circuitry 104 includes a switch 134 including a first terminal coupled to node 131 and a second terminal coupled to node 133. When switch 134 is closed, switch 134 shorts the inputs of comparator 132. Feedback circuitry 104 further includes a switch 136 including a first terminal coupled to node 131 and a second terminal coupled to a bias terminal labeled "vcm", which is configured to provide a common mode voltage that can be used to reset the feedback capacitors. Feedback circuitry 104 also includes a switch 138 including a first terminal coupled to node 133 and a second terminal coupled to the bias terminal.

Feedback circuitry 104 includes a feedback capacitor 140 including a first terminal coupled to node 131 and a second terminal coupled to a switch 142, which has a terminal coupled to a ground terminal 144 (labeled "gnd") and another terminal coupled to a reference voltage terminal 146 (labeled "vref"). In the illustrated embodiment, ground terminal 144 may be a power supply terminal to provide a reference signal, such as a second reference voltage rather than ground. In an embodiment, terminals 144 and 146 provide first and second reference voltages. In another embodiment, terminal 144 provides a negative reference voltage, and terminal 146 provides a positive reference voltage. Feedback circuitry 104 further includes a feedback capacitor 148 including a first terminal coupled to node 131 and a second terminal coupled to switch 150, which has a first terminal coupled to ground terminal 144 and a second terminal coupled to reference voltage terminal 146. While two feedback capacitors 140 and 148 are shown, feedback circuitry 104 may include any number of feedback capacitors.

Feedback circuitry 104 includes a capacitor 154 including a first terminal coupled to node 133 and a second terminal coupled to a first terminal of a switch 156, which has a second terminal coupled to node 144 and a third terminal coupled to node 146. Feedback circuitry 104 also includes a capacitor 158 including a first terminal coupled to node 133 and a second terminal coupled to a first terminal of a switch 160, which has a second terminal coupled to node 144 and a third terminal coupled to node 146. While two capacitors 154 and 158 are shown, feedback circuitry 104 may include any number of capacitors.

Comparator 132 includes an output coupled to a successive approximation register (SAR) control circuit 162, which includes an output coupled to an input of a multiplexer 164 to provide an SAR signal labeled "sar[n:0]". Multiplexer 164 includes a second input configured to receive a reset code (labeled "rst_cd[n:0]"), a control input to receive a select signal, and an output configured to provide a switch control signal (labeled "sar_cd[n:0]" to switches 156 and 160. Additionally, the SAR control circuit 162 provides an inverted version of the SAR switch control signal (labeled "sar_cd_n[n:0]") to switches 142 and 150.

In an example, the rail-to-rail input range is achieved by programming the values (Cs) of the sampling capacitors 120 and 122. In a particular example, sampling capacitors 120 and 122 may be programmed or configured to have a selected capacitance. The rail-to-rail swing can be achieved based on a ratio of the sum of the feedback capacitances divided by the programmed sampling capacitances according to Equation 2 above.

The conventional method to address multiple inputs includes adding a mux at the ADC input; however, the multiplexer may compromise speed since each input has to wait until the other inputs have finished their sampling and conversion operation. When the inputs are relatively slow, which is typical in control applications, the speed problem is made worse. While some circuits may include extra ADCs on the same chip to address the speed problem, such a solution uses a larger die area and introduces additional sources of measurement error, including possible mismatches between the ADCs.

By using multiple parallel sampling capacitive sampling circuits, such as the four capacitive sampling circuits 106, 108, 110, and 112, which can independently track each input, multiple inputs can be sampled without introducing the speed or mismatch issues that a multiplexer could introduce. While four capacitive sampling circuits 106, 108, 110, and 112 are shown in FIG. 1, circuit 100 may include any number of capacitive sampling circuits.

By controlling timing of the switches, circuit 100 may be controlled to achieve high ADC throughput rate (fadc) while each input can operate at a rate up to three times the ADC throughput rate to track and sample the input. Without the multiple capacitive sampling circuits 106, 108, 110, and 112, the ADC data rate would be cut to one-fourth for the same tracking time. Further, circuit 100 has improved common-mode rejection over prior circuits. Additionally, circuit 100 provides an expanded single-ended mode having double the single-ended full-range in a differential ADC topology as explained below.

Using capacitive sampling circuit 112 as an example, the improved common mode rejection and expanded single-ended mode can be explained using a charge analysis at the comparator input over different phases. In the following example, four groups of switches are discussed, including sampling switches 114 and 116 on the input side and switches 124, 126, and 128 on the amplifier (comparator) side, capacitive feedback reset switches 134, 136 and 138, conversion switches 130, 132 and 118, and SAR-controlled switches 142, 150, 156, and 160.

In a sampling phase, sampling switches 114, 116, 124, 126, and 128 are closed, conversion switches 118, 130 and 132 are opened, and capacitive feedback reset switches 134, 136 and 138 are closed. Further, the SAR switch control signal controls SAR-controlled switches 142, 150, 156, and 160 to provide an equivalent of half of the reference voltage (VREF/2) on the VREF-side terminals of capacitors 140, 148, 154, and 158. The charge stored on the terminals of capacitor 120 coupled to conversion switch 130 can be determined according to the following equation:

$$Q_{C120} = C_{Cs0} * (V_{CM} - V_{IN+}) \quad (3)$$

The charge stored on the terminals of capacitor 122 coupled to conversion switch 132 can be determined according to the following equation:

$$Q_{C122} = C_{Cs0} * (V_{CM} - V_{IN-}) \quad (4)$$

The charges ($Q_{fb}$) stored on the terminals of capacitors 140, 148, 154, and 158 coupled to nodes 131 and 133 can be determined according to the following equation:

$$Q_{fb+} = Q_{fb-} = C_{fb_{sum}} * \left(V_{CM} - \frac{V_{REF}}{2}\right) \quad (5)$$

where the charge ($Q_{fb+}$) refers to the charge on node 131 and the charge ($Q_{fb-}$) refers to the charge on node 133.

At the beginning of a conversion phase, sampling switches 114 and 116 on the input side and switches 124, 126, and 128 on the amplifier side are opened, capacitive feedback reset switches 134, 136 and 138 are opened, and conversion switches 130, 132, and 118 are closed. SAR switch control signal controls SAR-controlled switches 142, 150, 156, and 160 to maintain the equivalent of half of the reference voltage (VREF/2) on the VREF-side terminals of feedback capacitors 140, 148, 154, and 158. The charge at the comparator input side of capacitor 120 can be determined according to the following equation:

$$Q_{C120} = Q_{Cs0} * \left(V_{Node_{132}} - \frac{V_{IN+} + V_{IN-}}{2}\right) \quad (6)$$

The charge at the comparator input side of capacitor 122 can be determined according to the following equation:

$$Q_{C122} = Q_{Cs0} * \left(V_{Node_{128}} - \frac{V_{IN+} + V_{IN-}}{2}\right) \quad (7)$$

The charge at the side of feedback capacitors 140 and 148 coupled to the positive input of comparator 132 can be determined according to the following equation:

$$Q_{fb+} = C_{fb_{sum}} * \left(V_{Node_{132}} - \frac{V_{REF}}{2}\right) \quad (8)$$

The charge at the side of feedback capacitors 154 and 158 coupled to the negative input of comparator 132 can be determined according to the following equation:

$$Q_{fb-} = C_{fb_{sum}} * \left(V_{Node_{132}} - \frac{V_{REF}}{2}\right) \quad (9)$$

In operation, the charge is conserved at the comparator input (i.e., $Q_{comp\_input+} = Q_{C120} + Q_{fb+}$, and $Q_{comp\_input-} = Q_{C122} + Q_{fb-}$). In other words, the charges at the inputs of comparator 132 are the same during the sampling phase and conversion phase. By evaluating the equations, the voltage at the positive input of comparator 132 may be determined according to the following equation:

$$V_{CMP+} = V_{CM} - \frac{\left(\frac{V_{IN+} - V_{IN-}}{2}\right)}{1 + \frac{C_{fb_{sum}}}{Cs0}} \quad (10)$$

The voltage at the negative input of comparator 132 may be determined according to the following equation:

$$V_{CMP-} = V_{CM} + \frac{\left(\frac{V_{IN+} - V_{IN-}}{2}\right)}{1 + \frac{C_{fb_{sum}}}{Cs0}} \quad (11)$$

Thus, the common-mode of the comparator voltage (Vcmp) is constant at $V_{CM}$ from sampling phase to conversion phase, and the rejection to the input common-mode variation may be improved.

One disadvantage of a differential topology is that the dynamic range may be reduced to half for single-ended input since the full-scale is reduced from a rail-to-rail swing ($-V_{REF}$ to $V_{REF}$) to a zero-to-rail swing (0 to $V_{REF}$), assuming that the total capacitance of the capacitive sampling circuit 112 (Cs0) is equal to the sum of the feedback capacitances (i.e., Cs0=Cfb_sum) for simplicity, while the noise level stays the same.

The single-ended dynamic range degradation can be eliminated by expanding the single-ended mode to a full-scale, i.e., from zero to two times the reference voltage (0 $V_{REF}$*2) with a programmable reset code (rst_cd[n:0]) at the sampling phase, as shown in FIG. 1. The SAR control signal (sar_cd [n:0]) is configured so that the positive side (i.e., capacitors 140 and 148) of feedback circuit 104 are all connected to node 144 (gnd) and the negative side (capacitors 154 and 158) all connected to node 146 ($V_{REF}$). The charge on the feedback capacitors (140 and 148) at the sampling phase is determined according to the following equation:

$$Q_{fb+} = C_{fb_{sum}} * (V_{CM} - 0) \quad (12)$$

The charge on the feedback capacitors (154 and 158) at the sampling phase is determined according to the following equation:

$$Q_{fb-} = C_{fb_{sum}} * (V_{CM} - V_{REF}) \quad (13)$$

The SAR control signal (sar_cd[n:0]) is changed to the normal configuration at the beginning of conversion phase. Going through similar charge analysis as discussed above, the voltage at the positive input of comparator 132 is determined according to the following equation:

$$V_{CMP+} = V_{CM} - \frac{\left(\frac{V_{IN+} - V_{IN-} - \frac{V_{REF} * C_{fb_{sum}}}{Cs0}}{2}\right)}{1 + \frac{C_{fb_{sum}}}{Cs0}} \quad (14)$$

The voltage at the negative input of comparator 132 may be determined according to the following equation:

$$V_{CMP+} = V_{CM} + \frac{\left(\dfrac{V_{IN+} - V_{IN-} - \dfrac{V_{REF} * C_{fbsum}}{Cs0}}{2}\right)}{1 + \dfrac{C_{fbsum}}{Cs0}} \quad (15)$$

This is equivalent of shifting the single-ended input down by a ratio of the reference voltage multiplied by the sum of the feedback capacitances divided by the total capacitance of the capacitive sampling circuit (Cs0) (i.e.

$$\frac{V_{REF} * C_{fbsum}}{Cs0}\bigg),$$

and shifting the full-scale range of the single-ended input can be recovered as a range from 0 to twice the above value, i.e., $$\frac{V_{REF} * 2 * C_{fbsum}}{Cs0}.$$

It should be noted that the described shifting technique can also be used to shift the input range by any arbitrary value between the voltage rails (i.e., $-V_{REF} \leq X \leq V_{REF}$) to address input ranges that are not centered at zero, either differential or single-ended. Thus, the charges on feedback capacitors 140, 148, 154, and 158 may be configured to level-shift the signal to re-center the signal or to otherwise adjust the signal according to a selected value.

In an embodiment, during a feedback reset phase, conversion switches 118, 130, and 132 are open, feedback reset switches 134, 136, and 138 are closed, and SAR control circuit 162 controls switches 142, 150, 156, and 160 to apply a selected signal to each of the capacitors 140, 148, 154, and 158 such that the difference between the voltages on nodes 131 and 133 is approximately zero. In the illustrated embodiment, switch 134 may be redundant to switches 136 and 138; however, switch 134 may be used to short the inputs of comparator 132 to speed the reset operation. In some implementations, switch 134 may be omitted.

In a sample phase, switches 114, 116, 124, 126, and 128 are closed and switches 118, 130 and 132 are open. Switches 124, 126, and 128 operate to place a bias signal on second terminals of capacitors 120 and 122, and switches 114 and 116 provide first and second input signals from nodes to first terminals of capacitors 120 and 122. During a conversion phase, switches 114, 116, 124, 126, and 128 are open, and switches 118, 130, and 132 are closed. During this phase, switch 118 shorts the first terminals of capacitors 120 and 122, shifting the input signals to nodes 131 and 133, which are coupled to the positive and negative inputs of comparator 132, respectively.

In a single-input implementation, switch 114 may couple node 115 to an input signal, and switch 116 may couple node 117 to a power supply terminal, such as ground. In this instance, during conversion, switch 118 is closed, placing the first terminals of capacitors 120 and 122 at a common mode voltage and shifting the charge to nodes 131 and 133 and to the positive and negative inputs of comparator 132.

Regardless of whether the inputs are single-ended or differential, the multiple capacitive sampling circuits 106, 108, 110, and 112 allow a high data rate for the ADC circuit, with each input having a rate of 3 times the ADC throughput. The differential version has the further benefit of reducing or eliminating common mode error. One example of the switch timing that uses interleaved sampling to achieve a high ADC rate is described below with respect to FIG. 2.

Figure 2:
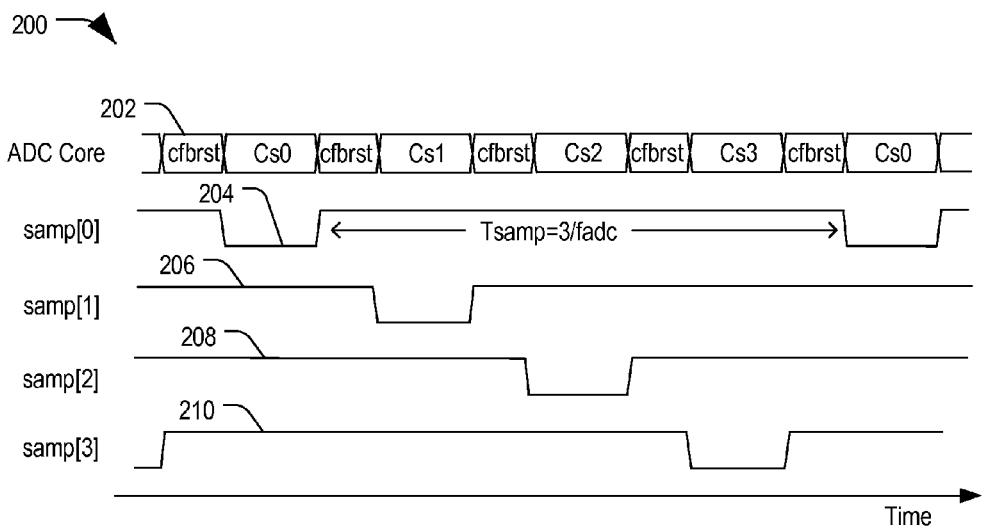
FIG. 2 is a timing diagram of a time-interleaved sampling technique that can be used with the SAR ADC of FIG. 1 according to an embodiment.

FIG. 2 is a timing diagram 200 of a time-interleaved sampling technique that can be used with the SAR ADC of FIG. 1 according to an embodiment. Timing diagram 200 includes a time signal 202 representing timing of the ADC core divided into conversion intervals corresponding to each of the capacitive sampling circuits 106, 108, 110, and 112 (labeled "Cs0", "Cs1", "Cs2", and "Cs3") separated by capacitive feedback reset intervals (labeled "cfbrst") for resetting capacitors 140, 148, 154, and 158 using switches 134, 136, and 138 and SAR control signals (sar_cd[n:0] and sar_cd_n[n:0]). The timing intervals are repeated sequentially, separated by feedback reset intervals with no wait period before repeating the sequence.

Prior to the first conversion interval (Cs0), a feedback reset interval occurs during which switches 134, 136, and 138 are closed, and switches 142, 150, 156 and 160 are controlled to charge capacitors 140, 148, 154, and 158 such that a difference between voltages on nodes 131 and 133 is approximately zero. Further, sampling switches 114, 116, 124, 126, and 128 of the first capacitive sampling circuit 112 and the sampling switches for capacitive sampling circuits 110, 108, and 106 are closed (as indicated by the logic high signal levels of signals 204, 206, 208, and 210). At the beginning of the conversion interval (Cs0), sampling switches 114, 116, 124, 126, and 128 are switched open (as indicated by the transition of signal 204 from logic high to logic low). During this conversion, conversion switches 118, 130 and 132 are closed to shift the voltages from the second terminals of capacitors 120 and 122 to nodes 131 and 133, respectively. Signals 206 and 208 remain at logic high, and signal 210 transitions from logic low to logic high, indicating the corresponding sampling switches of fourth capacitive sampling circuit 106 are closed. At the end of the conversion period Cs0, signal 204 transitions from logic low to logic high, and a capacitive feedback reset operation (labeled "cfbrst") is initiated. At this transition, conversion switches 118, 130 and 132 are opened, sampling switches 114, 116, 124, 126, and 128 are closed, switches 134, 136, and 138 are closed, and switches 142, 150, 156 and 160 are selectively closed to reset the differential voltage between nodes 131 and 133. After the capacitive feedback reset, at the beginning of the next conversion period Cs1, signal 206 transitions from logic high to logic low, converting the second sample. The process repeats through the four conversion periods, sequentially, sampling three inputs onto the capacitive sampling circuits while converting the sampled value on the remaining capacitive sampling circuit. Between each conversion, a reset operation is performed to reset the charges on feedback capacitors 140, 148, 154, and 158. Thus, the interleaved sample timing allows for sampling of multiple inputs for conversion by a shared analog-to-digital converter (comparator 132 and SAR control 162) without sacrificing the ADC throughput.

In the illustrated embodiment of FIG. 2, capacitive sampling circuit 106 is coupled to the first and second inputs of comparator 132 while the other capacitive sampling circuits 108, 110, and 112 are sampling respective ones of a plurality of input signals. When the conversion operation for capacitive sampling circuit 106 is complete, capacitive sampling circuit samples its input signals and the next capacitive sampling circuit (one of circuits 108, 110, and 112) is coupled to the first and second inputs of comparator 132. The timing allows for interleaving of sampling and conversion phases with respect to the plurality of capacitive sampling circuits 106, 108, 110, and 112.

Using the multiple capacitive sampling circuits 106, 108, 110, and 112, it is also possible to allow for the efficient realization of simultaneous sampling of a number of correlated signals. One possible example that allows for simultaneous sampling is described below with respect to FIG. 3.

Figure 3:
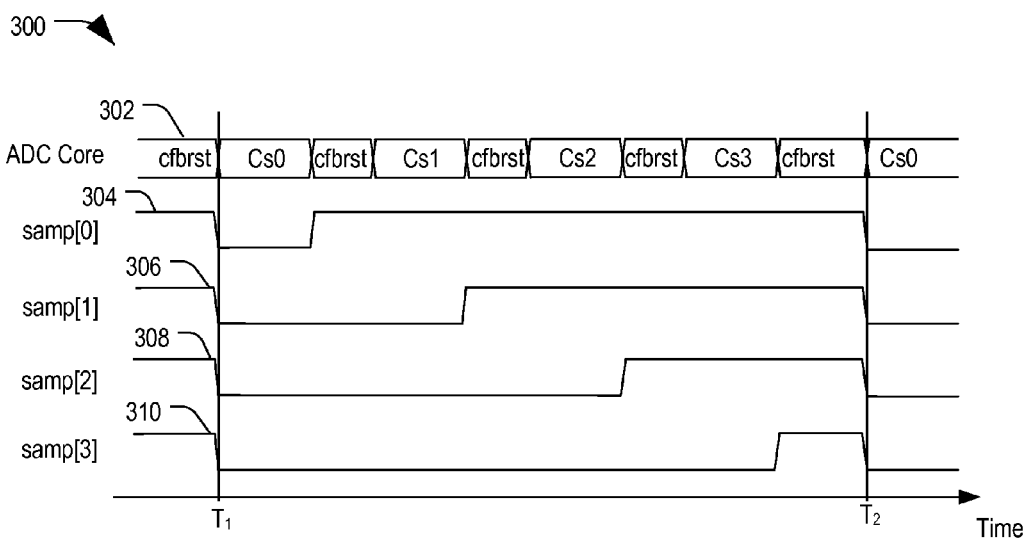
FIG. 3 is a timing diagram of a simultaneous sampling technique that can be used to convert samples from multiple sampling circuits using the SAR ADC of FIG. 1 according to an embodiment.

FIG. 3 is a timing diagram 300 of a simultaneous sampling technique that can be used to convert samples from multiple sampling circuits using the SAR ADC of FIG. 1 according to an embodiment. Diagram 300 includes a time signal 302 representing timing of the ADC core divided into conversion intervals corresponding to each of the capacitive sampling circuits 106, 108, 110, and 112 (labeled "cony Cs0", "cony Cs1", "cony Cs2", and "cony Cs3") separated by capacitive feedback reset intervals (labeled "cfbrst") for resetting capacitors 140, 148, 154, and 158 using switches 134, 136, and 138 and SAR control signals (sar_cd[n:0] and sar_cd_n [n:0]).

At a first time ($T_1$), each of the sample signals 304, 306, 308, and 310 transitions from a logic high level to a logic low level, decoupling the sampling capacitors 114 and 116 from the input terminal and opening switches 124, 126, and 128. During a first conversion interval (Cs0) immediately following first time ($T_1$), the first sampled value is converted by closing switches 118, 130 and 132, and then sampling signal 304 returns to a logic high level, at which time the sampling switches 118, 130, and 132 are opened, and a capacitive feedback reset operation is performed. After the capacitive reset operation, a second conversion operation is performed on capacitive sampling circuit 110 by closing switches corresponding to switches 118, 130, and 132 in circuit 112. After another capacitive feedback reset interval, the process is repeated for each conversion interval. After the last conversion interval (Cs3), the capacitive feedback reset interval may have a slightly longer wait time before resuming the sampling operation. Further, signals 304, 306, 308, and 310 are at a logic high level until the next sample time ($T_2$) at which each signal 304, 306, 308, and 310 transitions from a logic high level to a logic low level, again storing the sampled charge on the capacitors. The last capacitive feedback reset interval may be slightly longer than other reset intervals to allow time for the capacitive sampling circuit associated with the last conversion (i.e, capacitive sampling circuit 106) to open the conversion switches and to close the sampling switches and to allow the sample charge to settle before the next sample is captured by capacitive sampling circuits 106, 108, 110, and 112.

In this example, the sampled values are captured simultaneously at each of the capacitive sampling circuits, and the conversions take place sequentially thereafter. This technique allows for the efficient realization of simultaneous sampling of multiple signals, which may be correlated.

Whether the sampling is performed as an interleaved or a simultaneous sampling technique, the circuit 100 of FIG. 1 may be used to determine digital values corresponding to values at multiple inputs. One possible example of a method of determining a sampled value is described below with respect to FIG. 4.

Figure 4:
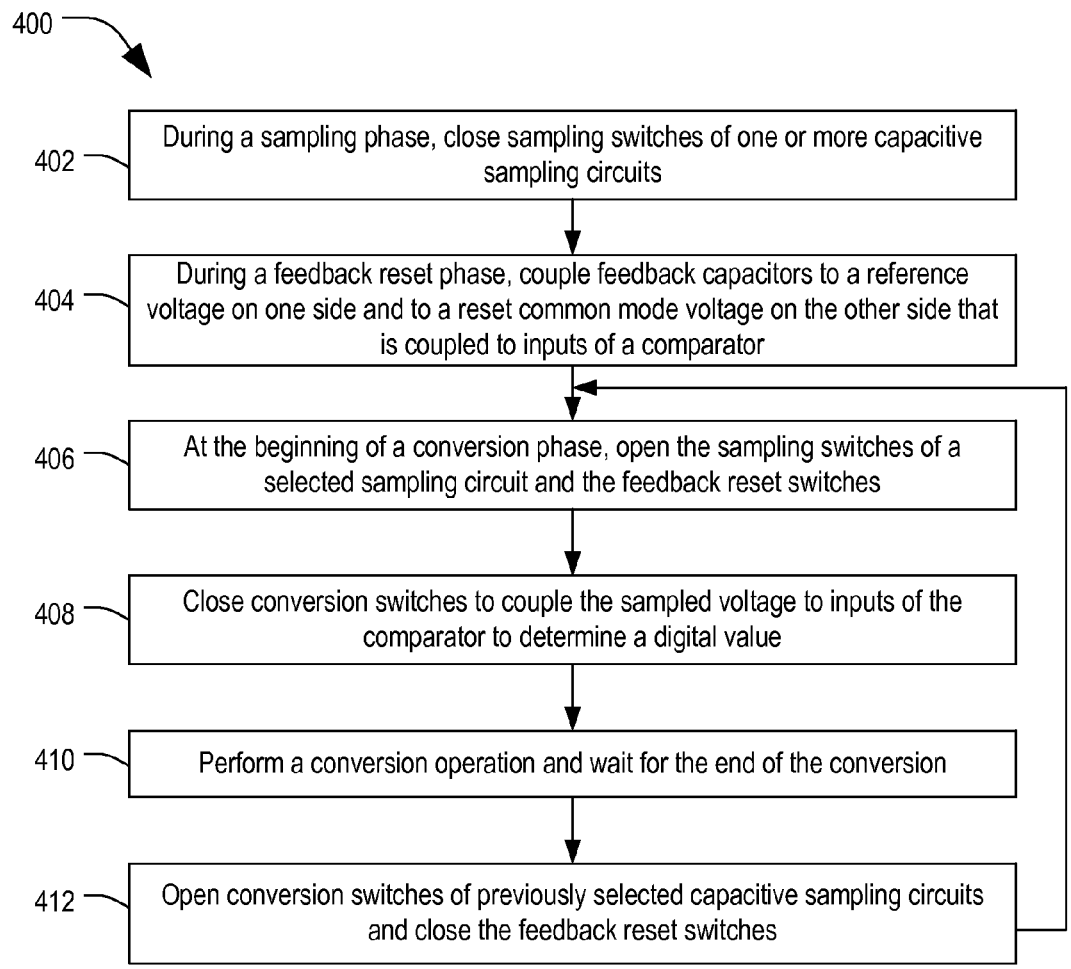
FIG. 4 is a flow diagram of an embodiment of a method of determining a sampled value using the circuit of FIG. 1.

FIG. 4 is a flow diagram of an embodiment of a method 400 of determining a sampled value using the circuit of FIG. 1. At 402, during a sampling phase, sampling switches of one or more capacitive sampling circuits are closed. In one embodiment, sampling switches include switches 114, 116, 124, 126, and 128 in FIG. 1. Continuing to 404, during a feedback reset phase, feedback capacitors are coupled to a reference voltage on one side and to a reset common mode voltage on the other side that is coupled to inputs of a comparator, such as comparator 132. In an embodiment, feedback capacitors 140, 148, 154, and 158 are coupled to a reset common mode voltage through switches 134, 136 and 138 and are coupled to selected voltages through switches 142, 150, 156, and 160.

Advancing to 406, at the beginning of a conversion phase, the sampling switches and the feedback reset switches are opened. Moving to 408, conversion switches are closed to couple the sampled voltage to inputs of the comparator to determine a digital value. In an example, the conversion switches include switches 118, 130, and 132 in FIG. 1. Proceeding to 410, a conversion operation is performed and the circuit waits for the end of the conversion. Continuing to 412, conversion switches of previously selected capacitive sampling circuit are opened, and the feedback reset switches are closed. Method 400 may then return to 406 to open the sampling switches of a selected sampling circuit. In some embodiments, method 400 returns to 406 after a delay period to allow time for the signals to settle.

In the embodiment of FIG. 4, block 402 may be performed for all of the capacitive sampling circuits simultaneously, or may be performed sequentially or with some interleaving of the timing such that the sampled values are stored on a capacitor of the capacitive sampling circuit prior to performance of a conversion operation. Further, the particular order of the illustrated blocks may vary. In an example, the operation in block 404 may be performed before the operation in block 402, without departing from the scope of the disclosure. Further, the conversion may be performed sequentially, converting the stored values from analog to digital values, one at a time. The sampling may then be repeated.

In conjunction with the circuit, timing diagrams and methods described above with respect to FIGS. 1-4, a circuit is described that can be configured to provide a single-ended or fully-differential SAR ADC with multiple capacitive sampling circuits and a separate feedback path. The sampling circuits may be operated to perform interleaved or simultaneous data sampling with conversion performed over several ADC intervals. By separating the sampling capacitors and the feedback capacitors, the reference voltage and feedback timing can be controlled in a power domain that is separate from the capacitive sampling circuits. Moreover, timing of sample conversion may be controlled to allow interleaved sampling without causing timing violations and without slowing the ADC throughput rate. Thus, a single ADC may be shared by multiple inputs. Moreover, by separating the feedback capacitors from the capacitors of the capacitive sampling circuit, the feedback capacitors may be programmed to adjust the dynamic range of the inputs. Thus, the circuit can provide a relatively low-voltage, high speed feedback path that supports a rail-to-rail input range. Further, the circuit can support simultaneous sampling of multiple input sources while sharing one core ADC. The ADC throughput rate can remain high, even if the input sources are relatively slow. Moreover, the circuit provides improved input common mode rejection and allows for expanded single-ended mode having double the range of a conventional single-ended topology, allowing for the full range of a differential ADC, by allowing for programmable shifting of the voltage level in the feedback path.

It is to be understood that, even though characteristics and advantages of the various embodiments have been set forth above, together with details of the structure and function of various embodiments, changes may be made in details, especially in the matters of structure and arrangement of parts within principles of the present disclosure to the full extent indicated by the broad meaning of the terms in which the appended claims are expressed. Although the present invention has been described with reference to preferred embodi-

What is claimed is:

1. A circuit comprising:
a comparator including a first input, a second input, and an output;
a plurality of capacitive sampling circuits configured to be selectively coupled to the first and second inputs, each of the plurality of capacitive sampling circuits comprising:
first and second capacitors;
first and second conversion switches configured to selectively couple the first and second capacitors to the first and second inputs, respectively;
at least one switch configured to selectively couple the first capacitor to the second capacitor on an input signal side of the first and second capacitors; and
wherein the first and second conversion switches of a selected one of the plurality of capacitive sampling circuits are closed to couple the selected one to the first and second inputs of the comparator during a conversion phase.

2. The circuit of claim 1, further comprising:
first and second input switches configured to selectively couple the first and second capacitors to first and second input signals, respectively; and
second and third switches configured to selectively couple the first and second capacitors to a bias voltage on an comparator side of the first and second capacitors.

3. The circuit of claim 2, wherein, during a sampling phase:
the first and second input switches of at least one of the plurality of capacitive sampling circuits are closed to couple the first and second capacitors of the at least one to the first and second input signals, respectively; and
the first second and third switches are closed to couple the second terminals of the first and second capacitors of the at least one to the bias voltage.

4. The circuit of claim 3, wherein, while the selected one of the plurality of capacitive sampling circuits is in the conversion phase, others of the plurality of capacitive sampling circuits are in the sampling phase.

5. The circuit of claim 3, wherein:
each of the plurality of capacitive sampling circuits enter the sampling phase at a first time, and
the plurality of capacitive sampling circuits transition to the conversion phase, one at a time, at different times.

6. The circuit of claim 2, wherein, during the conversion phase, the first switch is closed to short the input signal side of the first and second capacitors to one another.

7. The circuit of claim 1, further comprising:
a first feedback capacitor coupled to the first input of the comparator;
a first switch configured to selectively couple the first feedback capacitor to a first selected voltage;
a second feedback capacitor coupled to the second input of the comparator;
a second switch configured to selectively couple the second feedback capacitor to a second selected voltage; and
a third switch configured to selectively short the first and second inputs of the comparator to each other.

8. The circuit of claim 7, wherein, during a reset phase:
the first and second switches are selectively closed to apply the first and second selected voltages to the first and second feedback capacitors, respectively; and
the third switch is closed to reset the comparator to produce a zero voltage at the output.

9. The circuit of claim 7, further comprising:
a successive approximation register (SAR) control circuit including an input coupled to the output of the comparator and including an output to provide a control signal; and
a multiplexer including a first input to receive a reset signal, a second input to receive the control signal, and an output coupled to the first, second, and third switches to selectively couple the first and second feedback capacitors to the first and second selected voltages, respectively.

10. A method comprising:
sampling at least one input signal onto one or more of a plurality of capacitive sampling circuits from first and second input terminals during a sampling phase, each of the plurality of capacitive sampling circuits including a first capacitor and a second capacitor;
charging a plurality of feedback capacitors coupled to first and second inputs of a comparator to a programmable voltage level;
selectively coupling a selected one of the plurality of capacitive sampling circuits to the first and second inputs of the comparator during a conversion phase, the comparator configured to produce a digital value corresponding to the at least one input signal;
selectively coupling the first capacitor to the second capacitor on an input side opposite to the first and second inputs of the comparator during the conversion phase; and
producing a digital code related to the digital value using a successive approximation register.

11. The method of claim 10, wherein:
the at least one input signal includes a plurality of input signals; and
sampling the at least one input signal further comprises controlling a plurality of switches to couple the one or more of the plurality of capacitive sampling circuits to the plurality of input signals.

12. The method of claim 10, wherein sampling the at least one input signal comprises sampling the at least one input signal onto each of the plurality of capacitive sampling circuits at a first time.

13. The method of claim 12, wherein selectively coupling the selected one comprises selectively coupling each of the plurality of capacitive sampling circuits, one at a time and at different times, to the first and second inputs of the comparator.

14. The method of claim 10, wherein:
selectively coupling the selected one comprises selectively coupling each of the plurality of capacitive sampling circuits, one at a time and at different times, to the first and second inputs of the comparator; and
sampling the at least one input signal onto others of the plurality of capacitive sampling circuits when the selected one is coupled to the first and second inputs of the comparator.

15. The method of claim 10, further comprising shorting the first and second inputs of the comparator to each other during a feedback reset phase.

16. The method of claim 10, wherein charging the plurality of feedback capacitors comprises applying a programmable voltage to one or more of the plurality of feedback capacitors to shift a level of a signal provided to the first and second inputs of the comparator to provide a selected range for input signals centered around a voltage other than zero.

17. The method of claim 10, wherein each of plurality capacitive sampling circuits comprises at least one programmable capacitor, the method further comprising programming the at least one programmable capacitor to provide a programmable charge to adjust an input range of input signals to provide a rail-to-rail dynamic range.

18. A circuit comprising:
  a comparator including a first input, a second input, and an output;
  a successive approximation register (SAR) including an SAR input coupled to the output of the comparator and including an SAR output terminal configured to provide a control signal;
  a plurality of capacitive sampling circuits configured to be selectively coupled to the first and second inputs of the comparator, each of plurality capacitive sampling circuits comprises at least one programmable capacitor configurable to provide a programmable charge to adjust an input range of input signals to provide a rail-to-rail dynamic range; and
  a capacitive feedback circuit coupled to the first and second inputs of the comparator and responsive to the control signal to apply first and second feedback voltages to the first and second inputs.

19. The circuit of claim 18, wherein each of the plurality of capacitive sampling circuits is configured to sample one of a plurality of input signals at a first time, and is configured to be coupled to the first and second inputs of the comparator, one at a time, and at a second time.

20. The circuit of claim 18, wherein the plurality of capacitive sampling circuits is coupled to the first and second inputs of the comparator, one at a time, and are otherwise configured to sample respective ones of a plurality of inputs signals, interleaving sampling and conversion operations.

* * * * *